US012731765B2

(12) United States Patent
Huang et al.

(10) Patent No.: US 12,731,765 B2
(45) **Date of Patent: *Sep. 8, 2026**

(54) SUBSTRATE PROCESSING METHOD AND SUBSTRATE PROCESSING APPARATUS

(71) Applicant: Tokyo Electron Limited, Tokyo (JP)

(72) Inventors: Tejung Huang, Miyagi (JP); Shuhei Ogawa, Miyagi (JP); Cedric Thomas, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 425 days.

This patent is subject to a terminal disclaimer.

(21) Appl. No.: 18/368,028

(22) Filed: Sep. 14, 2023

(65) Prior Publication Data

US 2023/0420225 A1 Dec. 28, 2023

Related U.S. Application Data

(63) Continuation of application No. PCT/JP2022/009066, filed on Mar. 3, 2022.

(30) Foreign Application Priority Data

Mar. 15, 2021 (JP) ................................ 2021-041001

(51) Int. Cl.
*H01J 37/32* (2006.01)
*H10P 50/00* (2026.01)
*H10P 50/24* (2026.01)

(52) U.S. Cl.
CPC .. *H01J 37/32449* (2013.01); *H01J 37/32082* (2013.01); *H01J 37/32091* (2013.01);
(Continued)

(58) Field of Classification Search
CPC ........... H01J 37/32449; H01J 37/32082; H01J 37/32091; H01J 37/321; H01J 37/32137;
(Continued)

(56) References Cited

U.S. PATENT DOCUMENTS

2001/0044213 A1* 11/2001 Pandhumsoporn .......................... H01L 21/30655 438/719
2005/0112891 A1* 5/2005 Johnson ............ H01L 21/30655 438/691

(Continued)

FOREIGN PATENT DOCUMENTS

JP 2010-080846 A 4/2010
JP 2010-153702 A 7/2010

(Continued)

OTHER PUBLICATIONS

International Search Report issued on May 17, 2022 for WO 2022/196369 A1, 4 pages including English Translation.

*Primary Examiner* — Anita K Alanko
(74) *Attorney, Agent, or Firm* — XSENSUS LLP

(57) ABSTRACT

A substrate processing method in a substrate processing apparatus includes (a) supplying a process gas that contains a gas containing halogen other than fluorine and a gas containing oxygen, to a processing container in which a stage is disposed, the stage being configured to place thereon a workpiece having an etching target film, (b) performing plasma processing on the workpiece by first plasma generated from the process gas under first plasma generation conditions, (c) performing plasma processing on the workpiece by second plasma generated from the process gas under second plasma generation conditions in which a condition of radio-frequency power and a processing time (Continued)

are different from those in the first plasma generation conditions, and other conditions are the same, and (d) repeating (b) and (c).

15 Claims, 9 Drawing Sheets

(52) U.S. Cl.
CPC ...... *H01J 37/321* (2013.01); *H01J 37/32137* (2013.01); *H01J 37/32165* (2013.01); *H10P 50/244* (2026.01); *H10P 50/69* (2026.01); *H01J 2237/334* (2013.01)

(58) Field of Classification Search
CPC .......... H01J 37/32165; H01J 2237/334; H10P 50/244; H10P 50/69
See application file for complete search history.

(56) References Cited

U.S. PATENT DOCUMENTS

| | | | | |
|---|---|---|---|---|
| 2010/0167549 | A1* | 7/2010 | Ogasawara | H01L 21/30655 257/E21.252 |
| 2016/0049314 | A1* | 2/2016 | Nakahara | H01L 21/0337 438/694 |
| 2017/0125253 | A1* | 5/2017 | Tan | H01L 21/3065 |
| 2023/0386787 | A1* | 11/2023 | Inokuchi | H01J 37/32091 |

FOREIGN PATENT DOCUMENTS

| | | | |
|---|---|---|---|
| JP | 2012-142495 | A | 7/2012 |
| JP | 2012169390 | A | 9/2012 |
| JP | 2013-235912 | A | 11/2013 |
| JP | 2017-112350 | A | 6/2017 |

* cited by examiner

Cl*
O*
O*
W
204

203
Si
221
SiCl
W
204

203
Si
221
O*
222
222
W
204
SiCl

203
Si
221

SUBSTRATE PROCESSING METHOD AND SUBSTRATE PROCESSING APPARATUS

CROSS-REFERENCE TO RELATED APPLICATIONS

This application is a continuation application of International Patent Application No. PCT/JP2022/009066, filed on Mar. 3, 2022, which claims priority from Japanese patent application No. 2021-041001, filed on Mar. 15, 2021, all of which are incorporated herein in their entireties by reference.

TECHNICAL FIELD

The present invention relates to a substrate processing method and a substrate processing apparatus.

BACKGROUND

As the miniaturization of semiconductors has recently progressed, there is a demand for improvement of controllability in the hole shape during a dry etching process. For example, in the silicon etching processing, it has been proposed to use a mixed-gas containing $Cl_2$ gas and $O_2$ gas so as to prevent the occurrence of micro-trenches and to achieve improvement of the vertical processability of the shape or improvement of the mask selectivity (hereinafter, also simply referred to as "selectivity") (Japanese Patent Laid-Open Publication No. 2010-080846). Further, it has been proposed to perform etching by using an atomic layer etching (ALE) method that is superior in controllability of the etching amount while reducing the damage to a workpiece (Japanese Patent Laid-Open Publication No. 2013-235912).

SUMMARY

A substrate processing method according to an aspect of the present disclosure is a substrate processing method in a substrate processing apparatus, which includes (a) supplying a process gas that contains a gas containing halogen other than fluorine and a gas containing oxygen, to a processing container where a stage is disposed, the stage being configured to place thereon a workpiece having an etching target film, (b) performing plasma processing on the workpiece by first plasma generated from the process gas under first plasma generation conditions, (c) performing plasma processing on the workpiece by second plasma generated from the process gas under second plasma generation conditions in which a condition of radio-frequency power and a processing time are different from those in the first plasma generation conditions, and other conditions are the same, and (d) repeating (b) and (c).

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings which form a part hereof. The illustrative embodiments described in the detailed description, drawings, and claims are not meant to be limiting. Other embodiments may be utilized, and other changes may be made without departing from the spirit or scope of the subject matter presented herein.

Hereinafter, an embodiment of the disclosed substrate processing method and substrate processing apparatus will be described in detail on the basis of drawings. The disclosed technology is not limited by the following embodiment.

In the etching of a silicon film through a mask, vertical etching with a high selectivity is required such that after the etching, the bottom of a recess has a rectangular shape, and the residual film of the mask increases. However, the rectangular shape of the bottom and the selectivity have a trade-off relationship. Then, as described above, although the selectivity is improved by adding $O_2$ gas to $Cl_2$ gas, the bottom is likely to be tapered. Further, in the etching processing, when the step of depositing a protective film and the etching step are repeated, since process gases to be used are switched, it takes time to replace the process gas in a processing container. As a result, processing time is also lengthened, and the throughput is reduced. Thus, it is expected to perform etching that is faster than a gas switching method and may improve both the selectivity and the rectangular shape.

[Configuration of Plasma Processing Apparatus 100]

Figure 1:
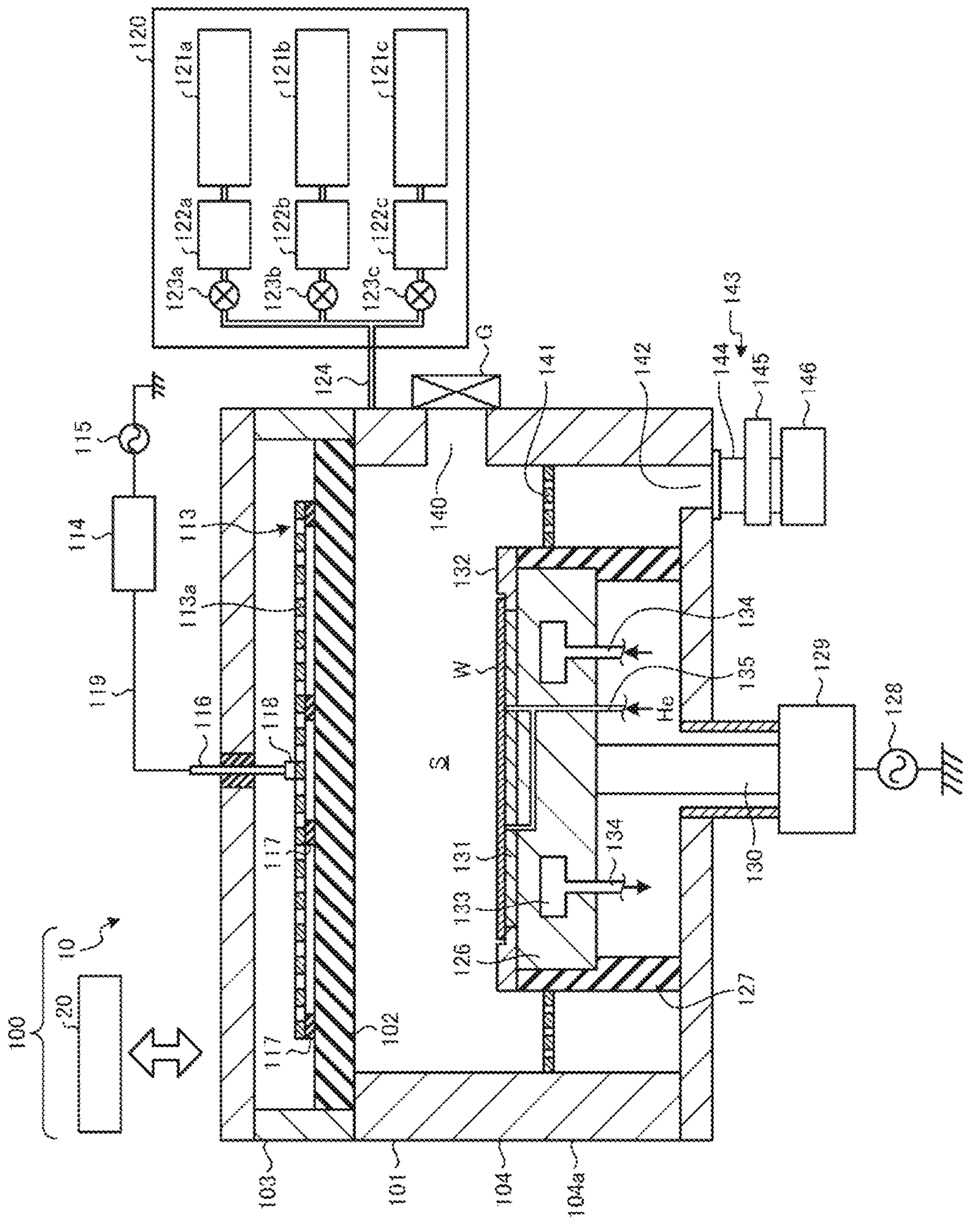
FIG. 1 is a view illustrating an example of a plasma processing apparatus in an embodiment of the present disclosure.

FIG. 1 is a view illustrating an example of a plasma processing apparatus in an embodiment of the present disclosure. The plasma processing apparatus 100 has a main body 10 and a controller 20. In the present embodiment, the plasma processing apparatus 100 performs etching processing on an etching target film formed on a semiconductor wafer (hereinafter, also referred to as a wafer) W that is an example of a workpiece, by using inductively coupled plasma (ICP). In the present embodiment, on the semiconductor wafer W, for example, an etching target film and a mask on the etching target film are formed.

The main body 10 has, for example, a substantially cylindrical airtight chamber 101 made of aluminum whose inner wall surface is anodized. The chamber 101 is grounded. The chamber 101 is vertically partitioned by a top ceiling plate 102. The upper surface side of the top ceiling plate 102 becomes an antenna chamber 103 where an antenna 113 is accommodated. Further, the lower surface side of the top ceiling plate 102 becomes a processing chamber 104 where plasma is generated. In the present embodiment, the top ceiling plate 102 is made of quartz, and constitutes a ceiling wall of the processing chamber 104. The top ceiling plate 102 may be made of ceramic such as $Al_2O_3$.

A side wall 104*a* of the processing chamber 104 is provided with a gas supply pipe 124, one end of which communicates with a space S within the processing chamber 104 and the other end of which communicates with a gas supply mechanism 120. The gas supplied from the gas supply mechanism 120 is supplied into the space S through the gas supply pipe 124. The gas supply mechanism 120 has gas supply sources 121*a* to 121*c*, mass flow controllers (MFC) 122*a* to 122*c*, and valves 123*a* to 123*c*. The gas supply mechanism 120 is an example of a gas supply.

The MFC 122*a* is connected to the gas supply source 121*a* that supplies an oxygen-containing gas, and controls the flow rate of the oxygen-containing gas supplied from the gas supply source 121*a*. In the present embodiment, the gas supply source 121*a* supplies, for example, $O_2$ gas. The valve 123*a* controls supplying of the oxygen-containing gas whose flow rate is controlled by the MFC 122*a*, to the gas supply pipe 124, and stopping of the supplying.

The MFC 122*b* is connected to the gas supply source 121*b* that supplies a halogen-containing gas, and controls the flow rate of the halogen-containing gas supplied from the gas supply source 121*b*. In the present embodiment, the gas supply source 121*b* supplies, for example, $Cl_2$ gas, HCl gas, HBr gas, or HI gas, as a gas containing halogen other than fluorine. The valve 123*b* controls supplying of the halogen-containing gas whose flow rate is controlled by the MFC 122*b*, to the gas supply pipe 124, and stopping of the supplying.

The MFC 122*c* is connected to the gas supply source 121*c* that supplies a rare gas, and controls the flow rate of the rare gas supplied from the gas supply source 121*c*. In the present embodiment, the gas supply source 121*c* supplies, for example, Ar gas. The valve 123*c* controls supplying of the rare gas whose flow rate is controlled by the MFC 122*c*, to the gas supply pipe 124, and stopping of the supplying.

The antenna 113 is disposed within the antenna chamber 103. The antenna 113 has an antenna wire 113*a* made of a highly conductive metal such as copper or aluminum. The antenna wire 113*a* is formed into any shape such as a ring shape or a spiral shape. The antenna 113 is separated from the top ceiling plate 102 by a spacer 117 constituted by an insulating member.

One end of a power supply member 116 extending upwards from the antenna chamber 103 is connected to a terminal 118 of the antenna wire 113*a*. One end of a power supply line 119 is connected to the other end of the power supply member 116, and a radio-frequency power supply 115 is connected to the other end of the power supply line 119, via a matcher 114. The radio-frequency power supply 115 supplies radio-frequency power with a frequency of 10 MHz or more (e.g., 27 MHz) to the antenna 113 via the matcher 114, the power supply line 119, the power supply member 116, and the terminal 118. Accordingly, an induced electric field is formed in the space S within the processing chamber 104 below the antenna 113, and the induced electric field forms plasma, from a gas supplied from the gas supply pipe 124. Then, inductively coupled plasma is generated within the space S. The antenna 113 is an example of a plasma generator. In the following description, the radio-frequency power supplied from the radio-frequency power supply 115 may be represented by second radio-frequency power, source, or Source in some cases.

A disk-shaped susceptor 126 on which a wafer W to be processed is placed is provided on the bottom wall of the processing chamber 104. The susceptor 126 is made of a conductive material such as aluminum. The susceptor 126 also functions as an electrode for attracting (biasing) ions in the generated plasma. The susceptor 126 is supported by a cylindrical susceptor support 127 constituted by an insulator.

Further, a radio-frequency power supply 128 for biasing is connected to the susceptor 126 via a feeding rod 130 and a matcher 129. Radio-frequency power with a frequency of 10 MHz or more (e.g., 13 MHz) is supplied to the susceptor 126 from the radio-frequency power supply 128. In the following description, the radio-frequency power supplied from the radio-frequency power supply 128 may be represented by first radio-frequency power, bias, or Bias in some cases. Further, the radio-frequency power supply 128 may act for plasma excitation, and plasma may be generated within the space S in some cases. Here, the plasma is capacitively coupled plasma (CCP).

An electrostatic chuck 131 for holding the wafer W by an electrostatic adsorption force is provided on the upper surface of the susceptor 126. On the outer periphery side of the electrostatic chuck 131, an edge ring 132 is provided to surround the wafer W. The edge ring 132 may be also called a focus ring.

Further, inside the susceptor 126, a flow path 133 through which, for example, a coolant such as cooling water flows is formed. The flow path 133 is connected to a chiller unit (not illustrated) via a pipe 134, and a temperature-controlled coolant is supplied into the flow path 133 from the chiller unit via the pipe 134.

A gas supply tube 135 for supplying, for example, a heat transfer gas such as He gas is provided between the electrostatic chuck 131 and the wafer W, inside the susceptor 126. The gas supply tube 135 passes through the electrostatic chuck 131, and the space within the gas supply tube 135 communicates with a space between the electrostatic chuck 131 and the wafer W. Further, a plurality of elevating pins (not illustrated) for transferring the wafer is provided in the susceptor 126 such that it may project and retract from the upper surface of the electrostatic chuck 131.

The side wall 104*a* of the processing chamber 104 is provided with a loading/unloading port 140 through which the wafer W is loaded into the processing chamber 104, and the wafer W is unloaded from the inside of the processing chamber 104. The loading/unloading port 140 may be opened/closed by a gate valve G. When a control is performed such that the gate valve G is placed in an open state, the wafer W may be loaded and unloaded via the loading/unloading port 140. Further, between the outer wall of the susceptor support 127 and the side wall 104*a* of the processing chamber 104, an annular baffle plate 141 in which a large number of through holes are formed is provided.

An exhaust port 142 is formed in the bottom wall of the processing chamber 104, and an exhaust mechanism 143 is provided in the exhaust port 142. The exhaust mechanism 143 has an exhaust pipe 144 connected to the exhaust port 142, an auto pressure controller (APC) valve 145 that controls the pressure inside the processing chamber 104 by adjusting the opening degree of the exhaust pipe 144, and a vacuum pump 146 that evacuates the inside of the processing chamber 104 through the exhaust pipe 144. The inside of the processing chamber 104 is evacuated by the vacuum pump 146, and the opening degree of the APC valve 145 is adjusted during etching processing with plasma, so that the inside of the processing chamber 104 is maintained at a predetermined degree of vacuum.

The controller 20 has a memory such as a read only memory (ROM) or a random access memory (RAM) and a processor such as a central processing unit (CPU). The processor within the controller 20 controls each unit of the main body 10 by reading and executing a program stored in the memory within the controller 20. The specific processing performed by the controller 20 will be described below.

[Application Pattern of Radio-Frequency Power]

Figure 2:
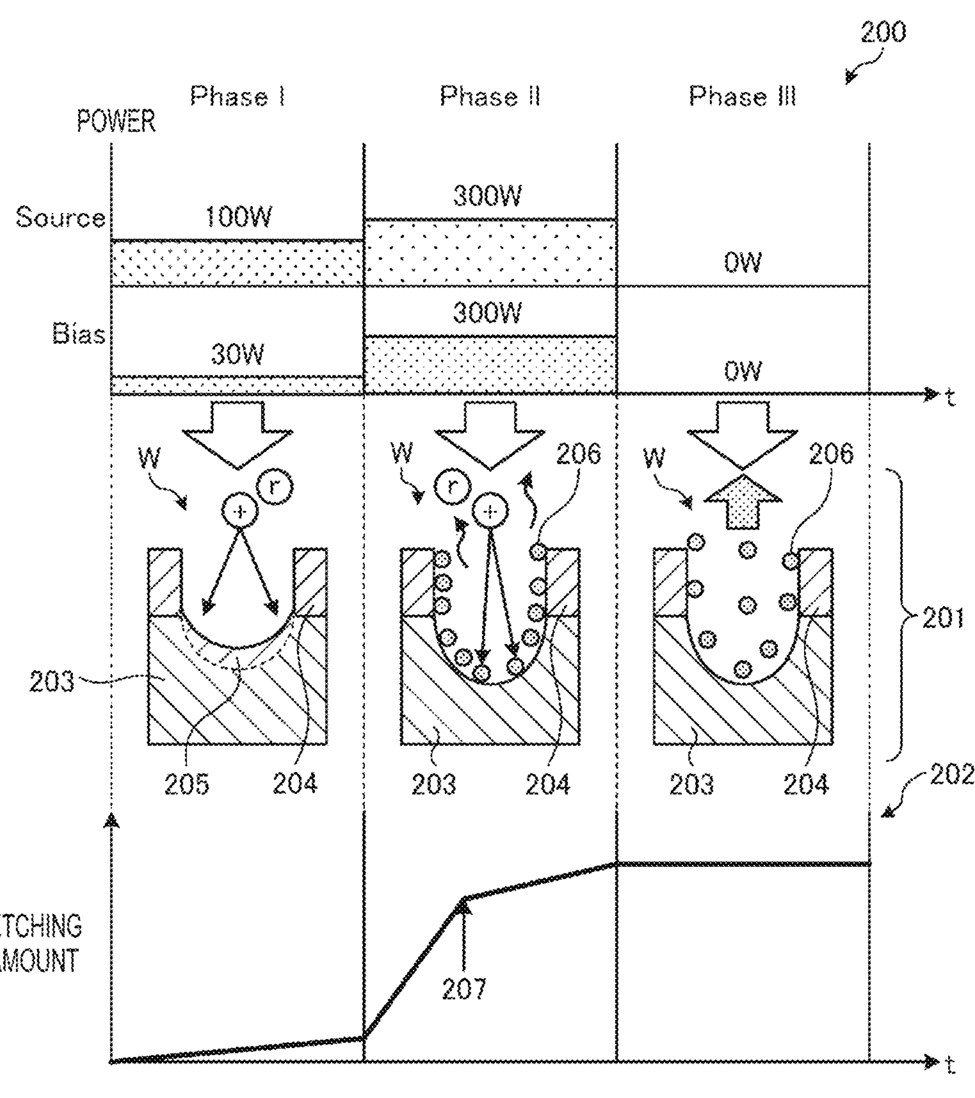
FIG. 2 is a view illustrating an example of the relationship between a radio-frequency power application pattern and etching in the present embodiment.
Figure 3:
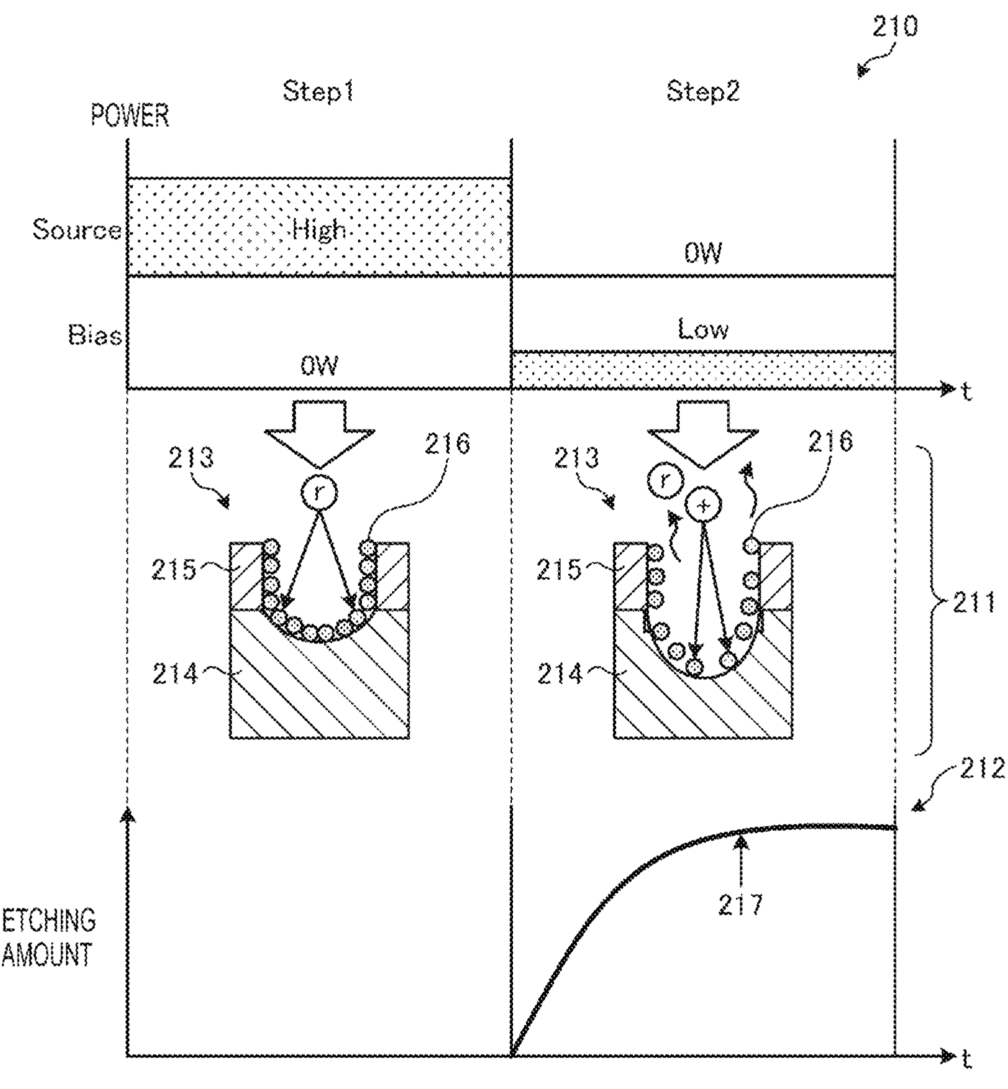
FIG. 3 is a view illustrating an example of the relationship between a radio-frequency power application pattern and etching in ALE.

Here, descriptions will be made on the relationship between a radio-frequency power application pattern and etching in the present embodiment and ALE, by using FIG. 2 and FIG. 3. The radio-frequency power application pattern in ALE illustrated in FIG. 3 is for comparison with the radio-frequency power application pattern of the present embodiment. FIG. 2 is a view illustrating an example of the relationship between the radio-frequency power application pattern and etching in the present embodiment. FIG. 2 illustrates an application pattern 200, schematic diagrams 201 corresponding to phases 1 to 3 of the application pattern 200, respectively, and a graph 202 of etching amounts. Further, in FIG. 2, a silicon film is used as an etching target film 203 on the wafer W, and a silicon nitride film is used as a mask 204. In FIG. 2, a mixed-gas of $Cl_2$, $O_2$, and Ar at predetermined flow rates is used as a process gas.

The application pattern 200 is a pattern by which the outputs of the first radio-frequency power (Bias) and the second radio-frequency power (Source) are changed in each of the phases 1 to 3. In FIG. 2, the phases 1 to 3 are represented by Phases I to III. In the phase 1, for example, Bias is 30 W, and Source is 100 W so that first plasma is generated. In the phase 2, for example, Bias is 300 W, and Source is 300 W so that second plasma is generated. In the phase 3, for example, Bias and Source are set to 0 W so that the generation of plasma is stopped. By repeating the phases 1 to 3 of the application pattern 200 as a unit cycle, it is possible to etch the etching target film 203 (silicon film) to a desired depth. The unit cycle of the application pattern 200 is on the order of μs to ms.

The phase 1 is a phase in which by the first plasma, the surface of the etching target film 203 is modified by adsorbing Cl ions or radicals (active species). In the phase 1, as illustrated in the schematic diagram 201, a modified region 205 in which Cl ions or radicals are adsorbed is formed on the surface of the etching target film 203 in the opening of the mask 204. The phase 2 is a phase in which by the second plasma, the modified region 205 formed on the surface of the etching target film 203 is etched. In the phase 2, as illustrated in the schematic diagram 201, the modified region 205 is etched, and reaction products (by-products) 206 are produced. The reaction products 206 are, for example, SiOCl, etc. The phase 3 is a phase in which the plasma generation is stopped, and the reaction products 206 produced in the phase 2 are exhausted. In the phase 3, as illustrated in the schematic diagram 201, the reaction products 206 are separated from the etching target film 203 and are exhausted. A part of the reaction products 206 adhere to the side wall of the recess of the etching target film 203 or the mask 204, as deposits.

The graph 202 illustrates etching amounts in the phases 1 to 3. In the phase 1, since the first radio-frequency power (Bias) of 30 W is applied, etching is slightly performed by Cl ions or radicals. In the phase 2, since the first radio-frequency power (Bias) is increased to 300 W, for example, ions or radicals of Cl and O are attracted to the wafer W side, and the etching of the modified region 205 progresses. At a timing 207, the entire modified region 205 is etched, and thereafter the etching target film 203 is directly etched. Thus, the slope of the etching amount becomes gentle. In the phase 3, since the plasma generation is stopped, etching does not progress. In this way, in the present embodiment, the application pattern 200 is repeated to etch the etching target film 203.

FIG. 3 is a view illustrating an example of the relationship between a radio-frequency power application pattern and etching in ALE. FIG. 3 illustrates an application pattern 210, schematic diagrams 211 corresponding to “steps 1 and 2” of the application pattern 210, respectively, and a graph 212 of etching amounts. Further, in FIG. 3, as in FIG. 2, a silicon film is used as an etching target film 214 on a wafer 213, and a silicon nitride film is used as a mask 215. In FIG. 3, process gases are switched between the “step 1” and the “step 2,” and a mixed-gas of $Cl_2$ and $O_2$ at predetermined flow rates and Ar gas are used, respectively.

The application pattern 210 is a pattern by which second radio-frequency power (Source) is supplied in the “step 1,” and first radio-frequency power (Bias) is supplied in the “step 2” so as to perform ALE. In FIG. 3, the “steps 1 and 2” are represented by “Steps 1 and 2.” In the “step 1,” for example, the output of Source is set to be increased (High), and Bias is set to 0 W so that plasma for modifying the etching target film 214 is generated. In the “step 2,” for example, the output of Bias is set to be decreased (Low), and Source is set to 0 W so that plasma for etching the modified region is generated. By repeating the “steps 1 and 2” of the application pattern 210 as a unit cycle, it is possible to etch the etching target film 214 (silicon film) to a desired depth. Since the process gases are switched between the “steps 1 and 2,” the unit cycle of the application pattern 210 is on the order of tens of seconds to several minutes. That is, the time for etching processing is longer in ALE than in the present embodiment.

The “step 1” is a step in which by the plasma formed by Source, the surface of the etching target film 214 is modified by adsorbing ions or radicals of Cl and O. In the “step 1,” as illustrated in the schematic diagram 211, etchants 216 such as ions or radicals of Cl and O are adsorbed on the surface of the etching target film 214 in the opening of the mask 215, and on the side surface of the mask 215. Here, the surface of the etching target film 214 is modified by the etchants 216. The “step 2” is a step in which by the plasma formed by Bias, the etchants 216 adsorbed on the surface of the etching target film 214 are etched with Ar ions.

The graph 212 illustrates etching amounts in the “steps 1 and 2.” In the “step 1,” since only the etchants 216 are adsorbed, etching is not performed. In the “step 2,” Ar ions are attracted to the wafer W side, and the etching of the etching target film 214 progresses with the adsorbed etchants 216. At a timing 217, when the adsorbed etchants 216 disappear, the etching does not progress. In this way, in ALE, the application pattern 210 is repeated to etch the etching target film 214.

[Reaction Mechanism]

Figure 4:
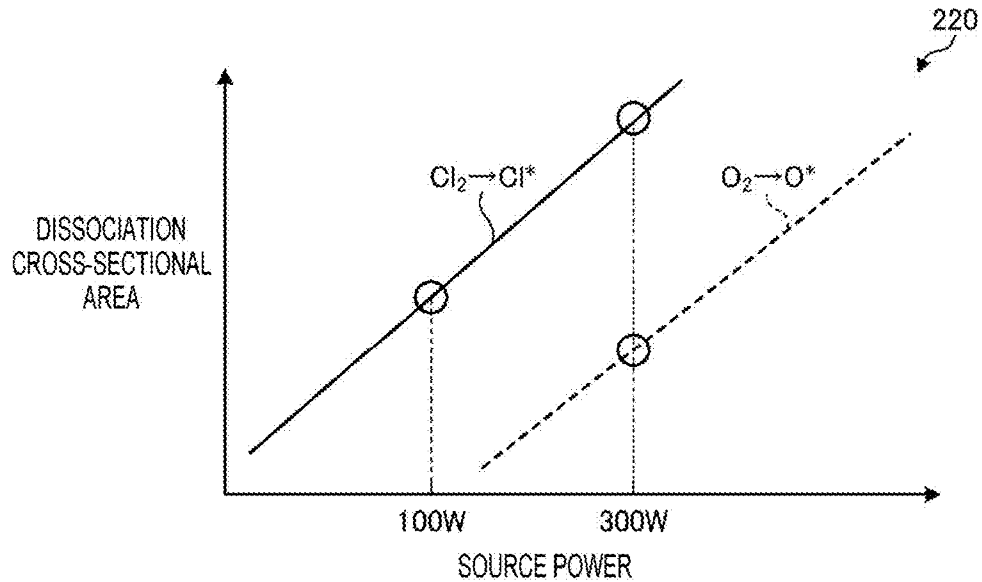
FIG. 4 is a view illustrating an example of the relationship between radio-frequency power and a dissociation cross-sectional area.

Next, descriptions will be made on the reaction mechanism in the phases 1 and 2 of the application pattern 200 in the present embodiment, by using FIGS. 4, 5, and 6A to 6C. FIG. 4 is a view illustrating an example of the relationship between radio-frequency power and a dissociation cross-sectional area. A graph 220 illustrated in FIG. 4 illustrates the relationship between Source power and a dissociation cross-sectional area for $Cl_2$ gas and $O_2$ gas. As illustrated in the graph 220, when Source is 100 W, that is, in the case of the phase 1 of the application pattern 200, $Cl_2$ gas dissociates into radicals Cl*, but $O_2$ gas does not dissociate. Meanwhile, when Source is 300 W, that is, in the case of the phase 2 of the application pattern 200, both $Cl_2$ gas and $O_2$ gas dissociate into radicals Cl* and O*. In the phase 2, when $Cl_2$ gas is dissociated but $O_2$ gas is not dissociated, the selectivity may not be obtained between silicon of the etching target film 203 and the silicon nitride film of the mask 204. Meanwhile, when a large amount of $O_2$ gas is dissociated, the recess of the etching target film 203 becomes tapered. Thus, in the phase 2, an adjustment is performed such that the amount of radicals O* does not increase. Further, in the application pattern 200, the radio-frequency power is changed between the phase 1 and the phase 2 so as to change the amounts of radicals Cl* and O* in each phase, and thus modification and etching are switched.

Figure 5:
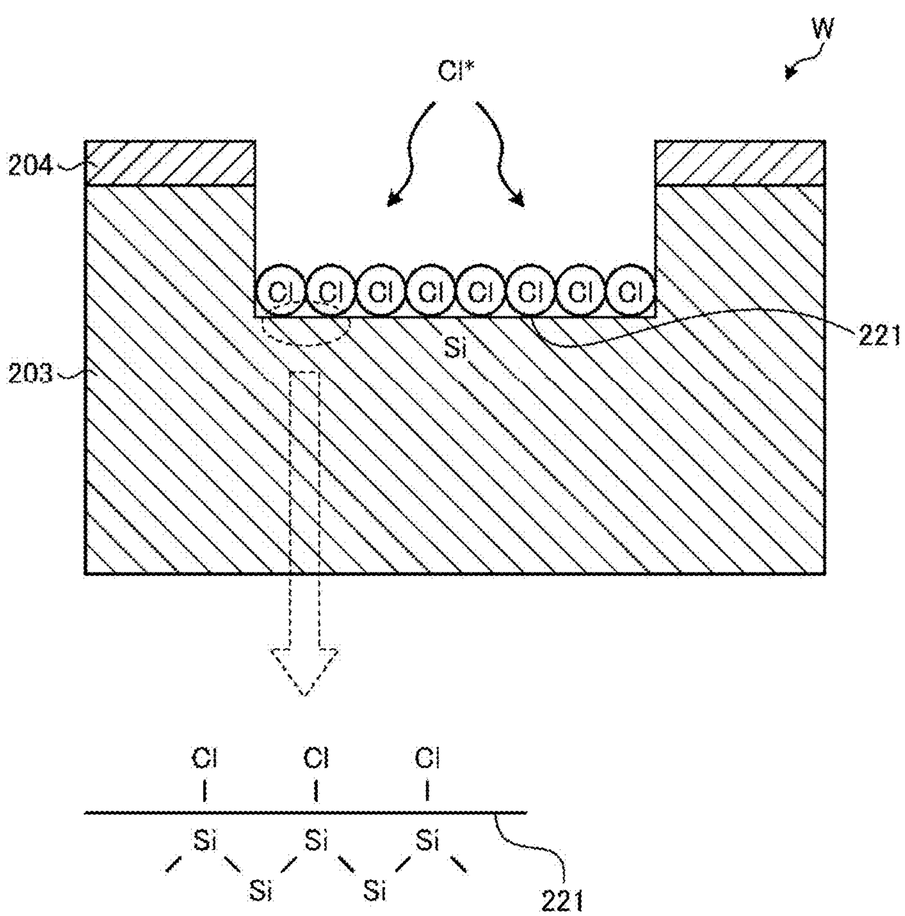
FIG. 5 is a view schematically illustrating an example of the state of a wafer in a phase 1.

FIG. 5 is a view schematically illustrating an example of the state of the wafer in the phase 1. As illustrated in FIG. 5, in the phase 1, by Bias, radicals Cl* are attracted to the surface of the etching target film 203 in the opening of the mask 204 on the wafer W. Here, on a bottom surface 221 of the recess formed on the etching target film 203, Cl combines with Si, and the surface is terminated with halogen (Cl), and then a mixed layer (modified layer) of SiCl is formed. That is, self-limitedness occurs, and thus adhesion of things other than halogen (Cl) is suppressed.

Figures 6A, 6B, 6C:
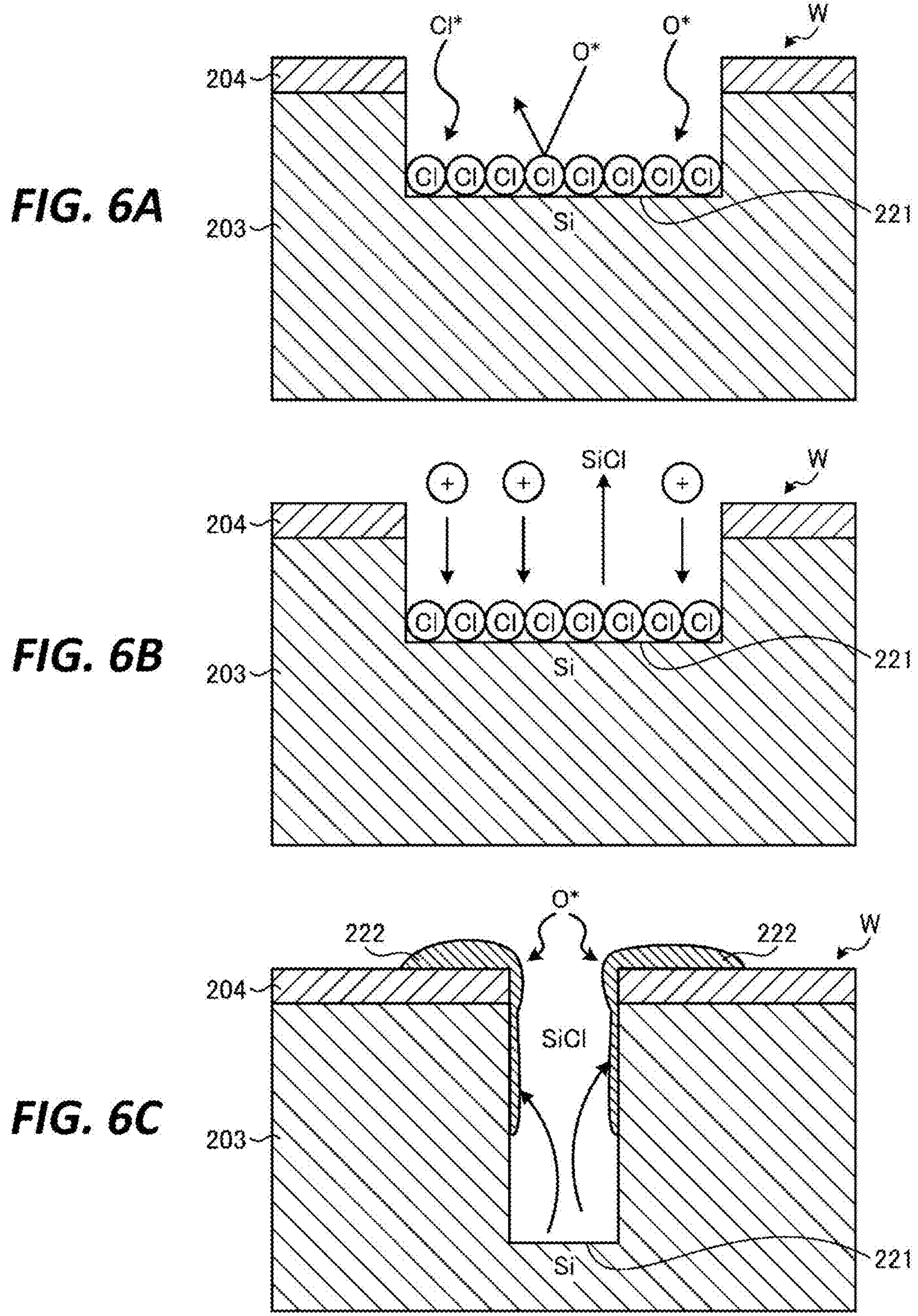
FIGS. 6A to 6C are views schematically illustrating an example of the state of the wafer in a phase 2.

FIGS. 6A to 6C are views schematically illustrating an example of the state of the wafer in the phase 2. In the phase 2, it is thought that the reactions illustrated in FIGS. 6A to 6C are simultaneously occurring. As illustrated in FIG. 6A, in the phase 2, Bias causes radicals Cl* and O* to be attracted to the surface of the wafer W. However, since the surface of the bottom surface 221 is terminated with Cl, adhesion of O to the bottom surface 221 is suppressed, and oxidation of the surface of the bottom surface 221 is suppressed. Further, as illustrated in FIG. 6B, in the phase 2, Bias causes ions or radicals, which are etchants, to be attracted to the surface of the wafer W, so that the surface of the bottom surface 221 is etched, and SiCl is produced as a reaction product. Further, as illustrated in FIG. 6C, in the phase 2, the produced SiCl becomes SiOCl through a reaction with O*, and adheres, as deposits 222, to the side wall of the recess of the mask 204 or the etching target film 203. The deposits 222 protect the side wall of the recess, and thus contribute to the improvement of selectivity or the improvement of bowing. Further, these hardly adhere to the vicinity of the bottom surface 221 of the recess, and thus also contribute to making the bottom surface 221 of the recess rectangular.

[Etching Method]

Figure 7:
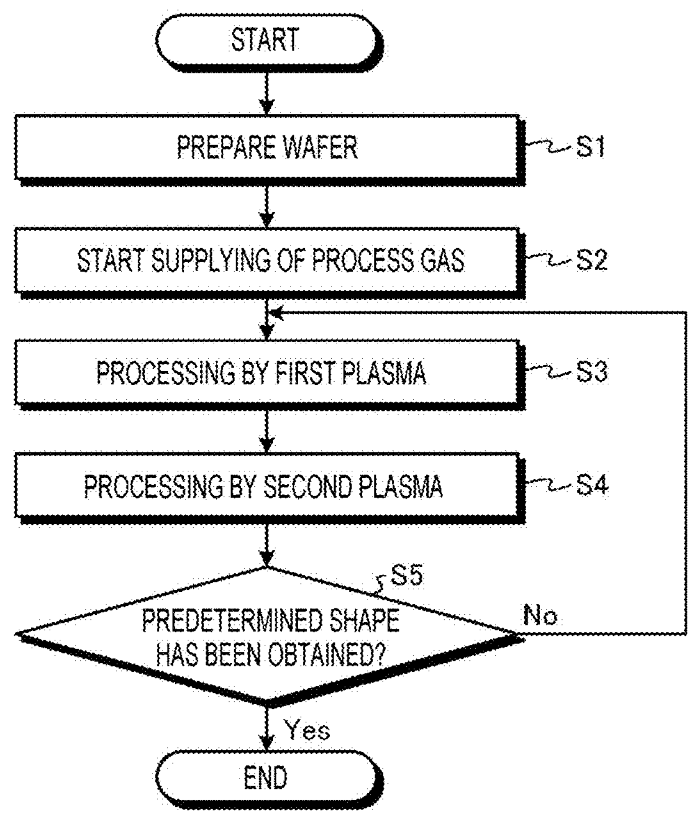
FIG. 7 is a flow chart illustrating an example of etching processing in the present embodiment.

Next, an etching method according to the present embodiment will be described. FIG. 7 is a flow chart illustrating an example of etching processing in the present embodiment.

In the etching method according to the present embodiment, the controller 20 opens the gate valve G of the loading/unloading port 140, and a wafer W having the mask 204 formed on the etching target film 203 is loaded into the processing chamber 104 and is placed on the electrostatic chuck 131 of the susceptor 126. The wafer W is held by the electrostatic chuck 131 when a DC voltage is applied to the electrostatic chuck 131. After that, the controller 20 closes the gate valve G and controls the exhaust mechanism 143 to exhaust the gas from the space S so that the atmosphere of the space S reaches a predetermined degree of vacuum. Further, the controller 20 controls a temperature control module (not illustrated) to perform temperature adjustment so that the temperature of the wafer W reaches a predetermined temperature (step S1).

Next, the controller 20 starts supplying of a process gas (step S2). The controller 20 supplies a mixed-gas of $Cl_2$, $O_2$, and Ar to the processing chamber 104 through the gas supply pipe 124, as a process gas that contains a gas containing halogen other than fluorine, an oxygen-containing gas and a rare gas. The supplied mixed-gas fills the space S within the processing chamber 104. The gas containing halogen other than fluorine may be a compound such as HCl, HBr, or HI. In the present embodiment, process gas conditions are the same until etching processing is completed.

The controller 20 controls the radio-frequency power supply 128 and the radio-frequency power supply 115 so as to supply first radio-frequency power (bias) for biasing to the susceptor 126 and to supply second radio-frequency power (source) for plasma excitation to the antenna 113. Due to an induced electric field formed in the space S, plasma of the mixed-gas is generated. That is, in the space S, halogen (Cl) radicals generated by first plasma generated under first plasma generation conditions are supplied to the surface of the etching target film 203, and then the surface of the etching target film 203 is modified. That is, the controller 20 performs plasma processing on the wafer W by the first plasma of the process gas generated under the first plasma generation conditions (step S3). The wafer W is exposed to the first plasma, and the bottom surface 221 of the recess of the etching target film 203 is mainly modified.

The controller 20 controls the radio-frequency power supply 128 and the radio-frequency power supply 115 so as to supply the first radio-frequency power (bias) for biasing to the susceptor 126 and to supply the second radio-frequency power (source) for plasma excitation to the antenna 113. Due to an induced electric field formed in the space S, plasma of the mixed-gas is generated. That is, in the space S, the etching target film 203 is etched by etchants generated by second plasma generated under second plasma generation conditions in which the radio-frequency power condition and the processing time are different from those in the first plasma generation conditions and other conditions are the same. That is, the controller 20 performs plasma processing on the wafer W by the second plasma of the process gas generated under the second plasma generation conditions in which the radio-frequency power condition and the processing time are different from those in the first plasma generation conditions and other conditions are the same (step S4). The wafer W is exposed to the second plasma, and ions or radicals which are etchants are attracted to the wafer W side by the bias potential. Then, etching of the etching target film 203 not masked by the mask 204 progresses. The time during which etching is performed by the second plasma in step S4 is set as such a period of time that the modified region 205 modified in step S3 is completely etched, and the etching target film 203 is also slightly etched.

The controller 20 determines whether a predetermined shape has been obtained through steps S3 and S4 (step S5). When determining that the predetermined shape has not been obtained (step S5: No), the controller 20 returns the process to step S3. Meanwhile, when determining that the predetermined shape has been obtained (step S5: Yes), the controller 20 ends the process. The controller 20 may include a step corresponding to the phase 3 of the application pattern 200 between step S4 and step S5, in which the supply of the first radio-frequency power and the second radio-frequency power is stopped to stop the plasma generation for a predetermined time.

When ending the process, the controller 20 stops the supply of the process gas. Further, the controller 20 applies a DC voltage in which plus/minus is reversed, to the electrostatic chuck 131 so as to remove static electricity, and the wafer W is separated from the electrostatic chuck 131. The controller 20 opens the gate valve G. The wafer W is unloaded from the space S of the processing chamber 104 via the loading/unloading port 140. In this way, in the plasma processing apparatus 100, it is possible to perform etching that is faster than a gas switching method and may improve both the selectivity and the rectangular shape.

[Experimental Result]

Figure 8:
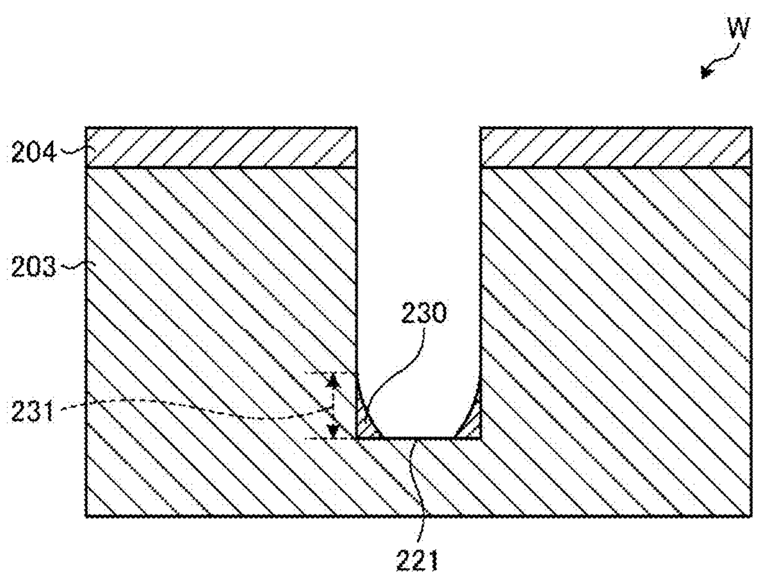
FIG. 8 is a view illustrating an example of the shape at the bottom.
Figure 9:
FIG. 9 is a view illustrating an example of the experimental results regarding the relationship between radio-frequency power, and a silicon recess and a shape.
Figure 9:
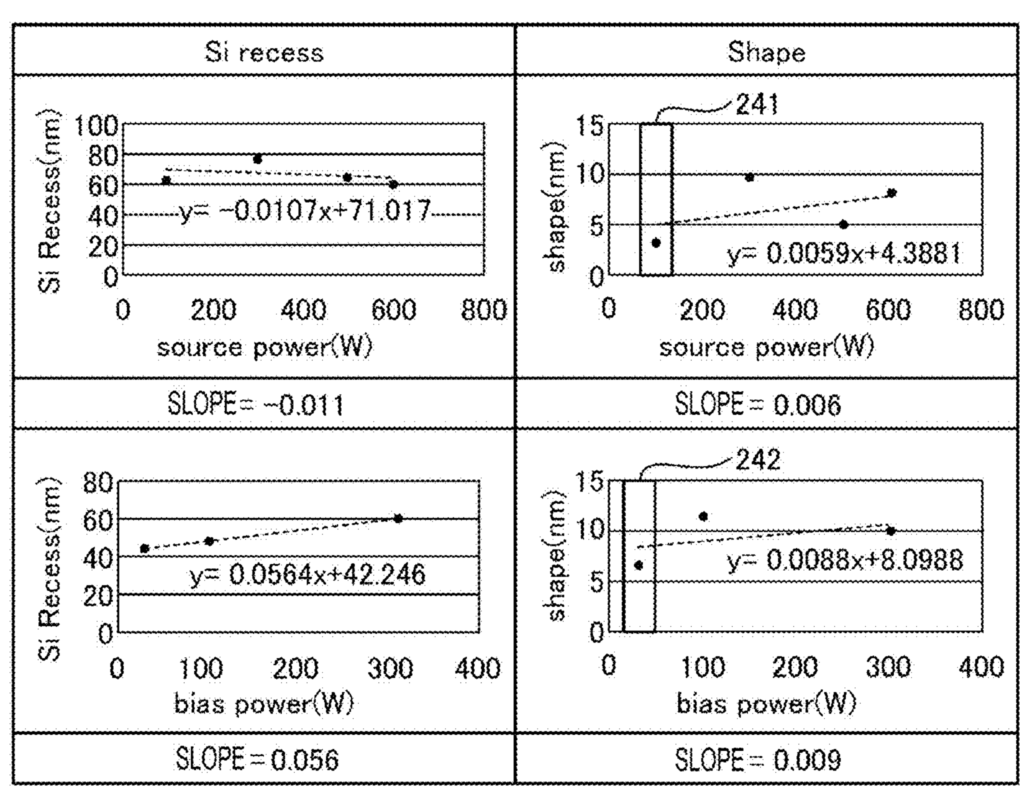

Next, descriptions will be made on the experimental results regarding the rectangular shape at the bottom in the recess of the etching target film 203, by using FIGS. 8 and 9. FIG. 8 is a view illustrating an example of the shape at the bottom. FIG. 9 is a view illustrating an example of the experimental results regarding the relationship between radio-frequency power, and a silicon recess and a shape. As illustrated in FIG. 8, a shape 230 is formed between the bottom surface 221 of the etching target film 203 and the side wall of the recess. It is assumed that the lower the height 231 of the shape 230, the more rectangular the recess of the etching target film 203.

In FIG. 9, in a case where the first radio-frequency power (Bias) and the second radio-frequency power (Source) are changed in the phase 1 of the application pattern 200, a table 240 summarizes the effect on the recess etching amount of the etching target film 203 (silicon recess), and the height 231 of the shape 230. Further, in the table 240, the upper row illustrates the case where the second radio-frequency power (Source) is changed, and the lower row illustrates the case where the first radio-frequency power (Bias) is changed. In FIG. 9, the recess etching amount of the etching target film 203 (silicon recess) is expressed as "Si recess," and the height 231 of the shape 230 is expressed as "Shape."

First, as seen in the case where the second radio-frequency power (Source) is changed in the upper row, even when the radio-frequency power is changed from 100 W to 600 W, the slope of the approximate straight line ($y=-0.0107x+71.017$) of the recess etching amount is −0.011, and the recess etching amount remains almost unchanged at about 60 nm. Therefore, it can be found that even when the second radio-frequency power (Source) is 100 W in the phase 1, it is possible to supply a sufficient amount of radicals. Meanwhile, although the slope of the approximate straight line ($y=0.0059x+4.3881$) of the height 231 of the shape 230 is 0.006, the range of the change in the height 231 is small, and thus the effect becomes large. Then, the smaller the radio-frequency power, the smaller the height 231. That is, as indicated by a frame 241, it can be found that the most rectangular shape is obtained when the second radio-frequency power (Source) is 100 W.

Next, as seen in the case where the first radio-frequency power (Bias) is changed in the lower row, even when the radio-frequency power is changed from 30 W to 300 W, the slope of the approximate straight line ($y=0.0564x+42.246$) of the recess etching amount is 0.056, and the recess etching amount remains almost unchanged at about 40 to 60 nm. Therefore, it can be found that the first radio-frequency power (Bias) in the phase 1 has little effect on the recess etching amount. Meanwhile, although the slope of the approximate straight line ($y=0.0088x+8.0988$) of the height 231 of the shape 230 is 0.009, the range of the change in the height 231 is small, and thus the effect becomes large. Then, the smaller the radio-frequency power, the smaller the height 231. That is, as indicated by a frame 242, it can be found that the most rectangular shape is obtained when the first radio-frequency power (Bias) is 30 W.

In this way, from the experimental results of the table 240, it can be found that 100 W is sufficient for the second radio-frequency power (Source) in the phase 1, and the bottom of the recess becomes tapered even if the radio-frequency power is further increased. Further, it can be found that the lower the first radio-frequency power (Bias) in the phase 1, the more rectangular the bottom of the recess becomes, and thus 30 W is good. Therefore, in the phase 1 of the application pattern 200 illustrated in FIG. 2, the second radio-frequency power (Source) is 100 W, and the first radio-frequency power (Bias) is 30 W.

[Modification]

In the above-described embodiment, the first plasma and the second plasma are inductively coupled plasma (ICP), but are not limited to this. As a plasma generation method, the first plasma and the second plasma may be capacitively coupled plasma (CCP). Further, regarding the output of the radio-frequency power, the application power of the radio-frequency power under the second plasma generation conditions may be higher than the application power of the radio-frequency power under the first plasma generation conditions. Further, regarding the frequency of the radio-frequency power, the frequency of the radio-frequency power under the second plasma generation conditions may be higher than the frequency of the radio-frequency power under the first plasma generation conditions. Further, in the first plasma generation conditions and the second plasma generation conditions, the radio-frequency power condition and the processing time may be adjusted according to the depth of the etched etching target film 203.

Further, in the above-described embodiment, etching processing is performed on the wafer W having the mask 204 formed on the etching target film 203, but the present disclosure is not limited to this. For example, etching processing for etching silicon may be performed on a wafer formed with silicon (Si) surrounded by a silicon nitride film (SiN).

Further, in the above-described embodiment, the silicon film may be exemplified as the etching target film 203, but the present disclosure is not limited to this. For example, the etching target film 203 may be a film containing at least silicon or germanium. Further, the etching target film 203 may be a single-layer film of any one of silicon, germanium, and silicon germanium, or a laminated film of two or more thereof.

Further, in the above-described embodiment, the silicon nitride film may be exemplified as the mask 204, but the present disclosure is not limited to this. For example, for the mask 204, silicon oxide ($SiO_2$) or silicon nitride oxide (SiON) may be used as a silicon compound.

As above, according to the present embodiment, the controller 20 executes a step (a) of supplying a process gas that contains a gas containing halogen other than fluorine and a gas containing oxygen, to a processing container (the chamber 101, the processing chamber 104) where a stage (the susceptor 126) is disposed. The stage places thereon a workpiece (the wafer W) having an etching target film. The controller 20 executes a step (b) of performing plasma processing on the workpiece by first plasma generated from the process gas under first plasma generation conditions. The controller 20 executes a step (c) of performing plasma processing on the workpiece by second plasma generated from the process gas under second plasma generation conditions in which a condition of radio-frequency power and a processing time are different from those in the first plasma generation conditions, and other conditions are the same. The controller 20 executes a step (d) of repeating (b) and (c). As a result, it is possible to perform etching that is faster than a gas switching method and may improve both the selectivity and the rectangular shape.

Further, according to the present embodiment, in (b), radicals of the halogen, which are generated by the first plasma, are supplied to a surface of the etching target film. Further, in (c), the etching target film is etched by etchants generated by the second plasma. As a result, it is possible to perform etching that is faster than a gas switching method and may improve both the selectivity and the rectangular shape.

Further, according to the present embodiment, the second plasma generation conditions are conditions under which a bias potential is generated on the workpiece. As a result, the etching target film may be etched.

Further, according to the present embodiment, in (b), a generation amount of radicals of the oxygen generated by the first plasma is less than a generation amount of radicals of the oxygen generated by the second plasma in (c). As a result, it is possible to suppress the bottom surface from becoming tapered in the recess of the etching target film.

Further, in the present embodiment, a step (e) of generating no plasma is executed. Further, in (d), (b), (c), and (e) are repeated in the order of (b), (c), and (e). As a result, it is possible to discharge the produced reaction products.

Further, in the present embodiment, conditions of the process gas introduced in (e) are the same conditions as conditions of the process gas introduced in (b) and (c). As a result, it is possible to suppress a throughput reduction caused by switching of process gases.

Further, according to the present embodiment, the etching target film is a film containing at least silicon or germanium. As a result, it is possible to etch these films while improving both the selectivity and the rectangular shape.

Further, according to the present embodiment, the etching target film is a single-layer film of any one of silicon, germanium, and silicon germanium, or a laminated film of two or more thereof. As a result, it is possible to etch these films while improving both the selectivity and the rectangular shape.

Further, according to the present embodiment, the workpiece further has a mask made of a silicon compound, on the etching target film. Further, the etching target film is etched through an opening of the mask. As a result, it is possible to etch the etching target film according to the opening of the mask while improving both the selectivity and the rectangular shape.

Further, according to the present embodiment, the workpiece has a first region composed of the etching target film, and a second region composed of a silicon compound, and the first region is selectively etched over the second region. As a result, it is possible to etch the first region while improving both the selectivity and the rectangular shape.

According to the present embodiment, the silicon compound is at least one of silicon oxide, silicon nitride, and silicon nitride oxide. As a result, it is possible to etch the first region while improving both the selectivity and the rectangular shape.

Further, according to the present embodiment, in the first plasma generation conditions and the second plasma generation conditions, the condition of the radio-frequency power and the processing time are adjusted according to a depth of the etched etching target film. As a result, it is possible to control the range of a protective film by reaction products (deposits).

Further, according to the present embodiment, in the second plasma generation conditions, application power of the radio-frequency power is higher than application power of the radio-frequency power in the first plasma generation conditions. As a result, it is possible to repeat the modification (adsorption) step and the etching step.

Further, according to the present embodiment, in the second plasma generation conditions, a frequency of the radio-frequency power is higher than a frequency of the radio-frequency power in the first plasma generation conditions. As a result, it is possible to repeat the modification (adsorption) step and the etching step.

Further, according to the present embodiment, the first plasma and the second plasma are inductively coupled plasma or capacitively coupled plasma. As a result, it is possible to repeat the modification (adsorption) step and the etching step.

Further, in the above-described described embodiment, inductively coupled plasma (ICP) has been exemplified as a plasma source, but the present disclosure is not limited to this. For example, any plasma source such as capacitively coupled plasma (CCP), microwave plasma and magnetron plasma may be used as a plasma source.

Further, in the above-described embodiment, a silicon film has been exemplified as the etching target film, but the present disclosure is not limited to this. For example, various silicon-containing films such as a silicon oxide film or a silicon nitride film may be used for the etching target film, and may also be applied when a mask for etching is a silicon-containing film that is different from the etching target film and allows the selectivity to be obtained with respect to the etching target film.

According to the present disclosure, it is possible to perform etching that is faster than a gas switching method and may improve both the selectivity and the rectangular shape.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method in a substrate processing apparatus, the substrate processing method comprising:

(a) supplying a process gas that contains a gas containing halogen other than fluorine and a gas containing oxygen, to a processing container in which a stage is disposed, the stage being configured to place thereon a workpiece including an etching target film;

(b) performing a first plasma processing on the workpiece by first plasma generated from the process gas under first plasma generation conditions;

(c) performing a second plasma processing on the workpiece by second plasma generated from the process gas under second plasma generation conditions in which a condition of radio-frequency power and a processing time are different from those in the first plasma generation conditions, and at least some of other conditions are substantially the same;

(d) generating no plasma; and (e) repeating (b), (c), and (d) in an order of (b), (c), and (d).

2. The substrate processing method according to claim 1, wherein in (b), radicals of the halogen, which are generated by the first plasma, are supplied to a surface of the etching target film, and in (c), the etching target film is etched by etchants generated by the second plasma.

3. The substrate processing method according to claim 1, wherein the second plasma generation conditions are conditions under which a bias potential is generated on the workpiece.

4. The substrate processing method according to claim 1, wherein in (b), a generation amount of radicals of the oxygen generated by the first plasma is less than a generation amount of radicals of the oxygen generated by the second plasma in (c).

5. The substrate processing method according to claim 1, wherein a condition of the process gas introduced in (d) is a same condition as conditions of the process gas introduced in (b) and (c).

6. The substrate processing method according to claim 1, wherein the etching target film is a film containing at least silicon or germanium.

7. The substrate processing method according to claim 6, wherein the etching target film is a single-layer film of any one of silicon, germanium, and silicon germanium, or a laminated film of two or more thereof.

8. The substrate processing method according to claim 1, wherein the workpiece further includes a mask made of a silicon compound, on the etching target film, and the etching target film is etched through an opening of the mask.

9. The substrate processing method according to claim 1, wherein the workpiece has a first region composed of the etching target film, and a second region composed of a silicon compound, and the first region is selectively etched over the second region.

10. The substrate processing method according to claim 8, wherein the silicon compound is at least one of silicon oxide, silicon nitride, and silicon nitride oxide.

11. The substrate processing method according to claim 1, wherein in the first plasma generation conditions and the second plasma generation conditions, the condition of the radio-frequency power and the processing time are adjusted according to a depth of the etched etching target film.

12. The substrate processing method according to claim 1, wherein in the second plasma generation conditions, application power of the radio-frequency power is higher than application power of the radio-frequency power in the first plasma generation conditions.

13. The substrate processing method according to claim 1, wherein in the second plasma generation conditions, a frequency of the radio-frequency power is higher than a frequency of the radio-frequency power in the first plasma generation conditions.

14. The substrate processing method according to claim 1, wherein the first plasma and the second plasma are inductively coupled plasma or capacitively coupled plasma.

15. A substrate processing apparatus comprising:

a processing container;

a stage disposed within the processing container, and configured to place thereon a workpiece having an etching target film; and a controller, wherein the controller is configured to:

(a) supply a process gas that contains a gas containing halogen other than fluorine and a gas containing oxygen, to a processing container in which a stage is disposed, the stage being configured to place thereon a workpiece including an etching target film;

(b) perform a first plasma processing on the workpiece by first plasma generated from the process gas under first plasma generation conditions;

(c) perform a second plasma processing on the workpiece by second plasma generated from the process gas under second plasma generation conditions in which a condition of radio-frequency power and a processing time are different from those in the first plasma generation conditions, and at least some of other conditions are substantially the same;

(d) generate no plasma; and (e) repeat (b), (c), and (d) in an order of (b), (c), and (d).

* * * * *